United States Patent [19]

Wong

[11] Patent Number: 4,508,758
[45] Date of Patent: Apr. 2, 1985

[54] ENCAPSULATED ELECTRONIC CIRCUIT

[75] Inventor: Ching-Ping Wong, Lawrence Township, Mercer County, N.J.

[73] Assignee: AT&T Technologies, Inc., New York, N.Y.

[21] Appl. No.: 453,004

[22] Filed: Dec. 27, 1982

[51] Int. Cl.³ .............................................. B05D 5/12
[52] U.S. Cl. ...................................... 427/96; 29/841; 427/97; 427/284; 427/387
[58] Field of Search ..................... 427/96, 97; 29/842; 427/284, 387; 528/901, 17, 20

[56] References Cited

U.S. PATENT DOCUMENTS

| | | | |
|---|---|---|---|
| 3,151,099 | 9/1964 | Ceyzeriat et al. | 260/46.5 |
| 3,629,228 | 12/1971 | Hartlein et al. | 528/901 X |
| 3,642,692 | 2/1972 | Hartlage | 528/901 X |
| 3,647,917 | 3/1972 | Schulz et al. | 528/901 X |
| 3,676,420 | 7/1972 | Fulton et al. | 528/901 X |
| 3,702,835 | 11/1972 | Greenlee | 260/18 S |
| 3,706,695 | 12/1972 | Huebner et al. | 117/226 |
| 3,706,840 | 12/1972 | Moyle et al. | 174/52 PE |
| 3,714,709 | 2/1973 | Liederbach | 29/841 |
| 3,719,635 | 3/1973 | Clark et al. | 528/901 X |
| 3,729,445 | 4/1973 | Smith et al. | 260/46.5 R |
| 3,840,492 | 10/1974 | Smith et al. | 260/37 SB |
| 3,847,848 | 11/1974 | Beers | 260/18 S |
| 3,968,055 | 7/1976 | Palmer | 252/506 |
| 3,996,189 | 12/1976 | Travnicek | 260/37 SB |
| 4,216,140 | 8/1980 | Simizu | 260/45.75 R |
| 4,230,754 | 10/1980 | Maher et al. | 428/76 |
| 4,257,932 | 3/1981 | Beers | 260/18 S |
| 4,318,939 | 3/1982 | Wong | 427/96 |
| 4,395,526 | 7/1983 | White et al. | 528/18 |

OTHER PUBLICATIONS

Western Electric Technical Digest, No. 36, Oct. 1974, New York, J. R. Wylie, "Selective Flow Coating of the Thin Film Integrated Circuits," pp. 33–34.
Patent Abstracts of Japan, vol. 5, No. 198, Dec. 16, 1981 & JP-A-56-122145.
Patent Abstracts of Japan, vol. 5, No. 19, Feb. 4, 1981 and JP-A-55-148446.
Patent Abstracts of Japan, vol. 5, No. 91, Jun. 13, 1981 and JP-A-56-36145.

*Primary Examiner*—Thurman K. Page
*Attorney, Agent, or Firm*—Joel F. Spivak

[57] ABSTRACT

In the manufacture of encapsulated hybrid circuits from a substrate having a plurality of such circuits contained thereon, individual devices are first mounted on the circuit, encapsulant having a yield point stress and viscosity so as not to creep or flow is applied around the periphery of each circuit on the substrate so as to form a wall or dam around each such circuit except for the bonding pads for external connection of each circuit, a second encapsulant is then flow coated over the circuit and devices contained thereon within the previously formed wall such that the second encapsulant is retained within the wall. The encapsulants are then cured or dried and the individual encapsulated circuit can then be further processed such as by separating the individual circuits on the substrate and applying external connectors to the bonding pads.

8 Claims, 7 Drawing Figures

ENCAPSULATED ELECTRONIC CIRCUIT

TECHNICAL FIELD

This invention relates to the encapsulation of electronic circuits and particularly to selective encapsulation employing a suitable resin formulation.

BACKGROUND OF THE INVENTION

While various types of encapsulants for electronic components have been known and used in the past, it has recently become advantageous to selectively encapsulate certain portions of electronic circuits such as hybrid type integrated circuits, while leaving other portions of the circuit initially free of encapsulant. For example, one may want to encapsulate and protect an active device region of an integrated circuit while leaving selected nonactive regions such as bonding pads or other areas free of encapsulant. Alternatively, as will hereinafter be shown, one may want to selectively apply encapsulant to a hybrid circuit so as to facilitate further processing in a manner which increases the yield and reduces the production cost for manufacturing such circuit.

Because of the proximity of adjacent components on hybrid integrated circuit, and the process steps needed to complete such a circuit, the rheology of encapsulated material is critical, especially where selective encapsulation may be desired. The encapsulant must be fluid enough to be deposited in the selected areas to be encapsulated while not exhibiting flow characteristics which cause it to flow or creep onto areas which are to remain bare. Thus, a delicate balance must be achieved for an encapsulant to be useful for this purpose.

SUMMARY OF THE INVENTION

The invention as described herein includes a method of selectively encapsulating portions of a circuit with an encapsulant which will essentially not creep or run but yet is readily dispensable. Also, a method of manufacturing encapsulated hybrid circuits employing such selective encapsulation, as well as an encapsulant formulation specifically suited for this use, is described.

The method of selective encapsulation comprises the step of applying an encapsulant having a yield point stress of from 2000 to 3200 dynes/cm$^2$ and a viscosity of from 700,000 to $1.2 \times 10^6$ centipoise over the area to be encapsulated.

The method of selective encapsulation as applied to the manufacture of an encapsulated hybrid circuit starting from a substrate having a plurality of such circuits contained thereon comprises the steps of (1) mounting individual devices on each circuit, (2) applying encapsulant having a yield point stress and a viscosity as aforesaid around the periphery of each circuit on the substrate so as to form a wall or dam around each such circuit except for the bonding pads for external connection of each such circuit, and (3) applying a second encapsulant which may be of a similar or different composition as the first encapsulant, so as to encapsulate the circuit and devices within the wall, to a level such that the second encapsulant is retained within the wall. The encapsulants are then cured or dried and the individual encapsulated circuits can then be further processed.

It has been found that in order to meet the requirements necessary for selective encapsulation of individual devices or for forming the wall as indicated above, the encapsulant must have a yield point and viscosity as previously set forth.

A novel encapsulant formulation having the desired properties is a silicone resin formulation based upon a dimethoxy terminated polydimethylsiloxane having from 15 to 45 parts of filler per hundred parts resin and from 5 to 50 parts of a trialkoxymethylsilane crosslinking agent per hundred parts resin.

DETAILED DESCRIPTION

Figure 1:
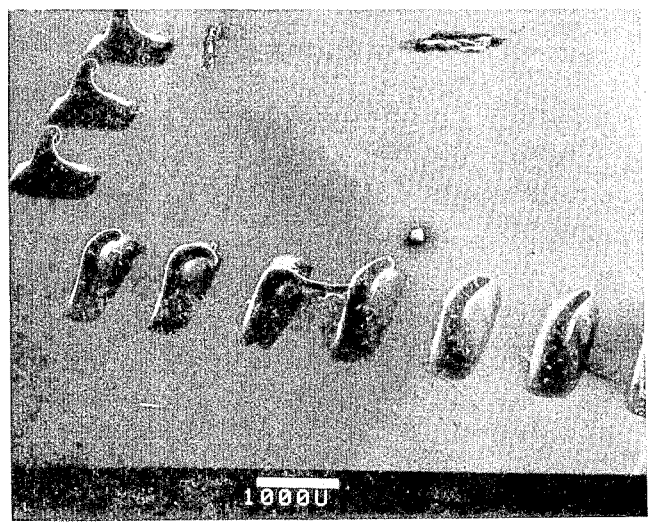
FIG. 1 is a photomicrograph showing a commercially available silicone encapsulant depicting what has been characterized as the wicking problem upon selective encapsulation.
Figure 2:
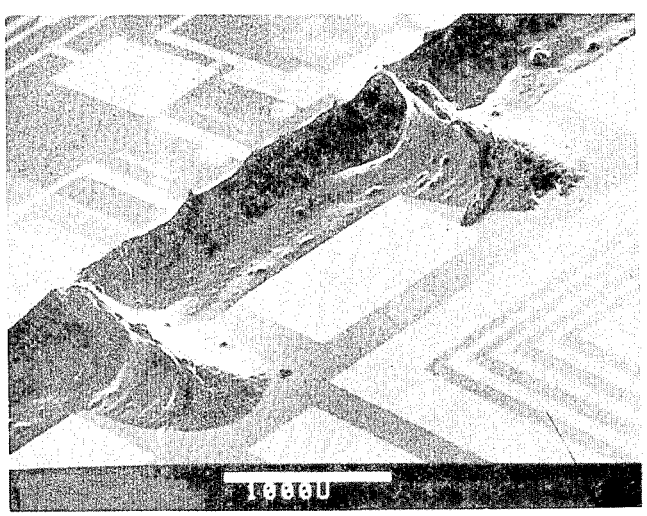
FIG. 2 is a photomicrograph showing the commercial encapsulant modified so as to have the properties required in accordance with this invention.

When one wishes to selectively encapsulate a portion of an electronic circuit, e.g., a particular device on a circuit or the peripheral area of the circuit, it is generally important not to allow the encapsulant to spread, creep or otherwise overlap onto any area not to be covered with the encapsulant. At the same time, the encapsulating material must be maintained in a consistency which facilitates dispensing of the encapsulant. Two phenomena typically observed when employing commercially available encapsulants are known as wicking and run-over. Wicking is manifested by an extended tail or wick which resembles the tip of a "Hershey ® Kiss" candy and which wick can extend beyond the confines of the selected area desired to be encapsulated. This problem is illustrated in FIG. 1 wherein a silicone resin known as DC 3145 supplied from Dow Corning Corporation was applied to a circuit. The extended wick or tip which can be seen in this photomicrograph often overlies areas which were to remain bare. Run-over is manifested by the running or creeping of the encapsulant over unwanted areas and often over the edge of the circuit substrate so as to interfere with further automated processing. In accordance with present processing techniques, the unwanted wicking and run-over must often be removed and repaired by hand before the circuit can be processed further, thereby increasing processing costs and for reducing yields.

I have discovered that the critical parameters in essentially eliminating wicking and run-over during encapsulation are the yield point stress and the viscosity of the encapsulating material. The yield point stress, generally given in dynes/cm$^2$, is the maximum stress observed when plotting stress versus strain.

Suitable yield point stresses and viscosities are from 2000 to 3200 dynes/cm$^2$ and from 700,000 to $1.2 \times 10^6$ centipoise, respectively. The aforementioned commercial encapsulant sold by Dow Corning has a yield point stress of only 900 dynes/cm$^2$ at 0.9 percent strain and a viscosity of about 400,000 centipoise.

While the preferred embodiment is described in terms of utilizing an RTV type silicone resin as the base encapsulating material, it should be understood that heat curable silicone resins, as well as other base resins which possess the required electrical properties, as is known in the art, can form the basis of a suitable formulation having the required yield point stress and viscosity in the range as previously set forth. Similarly, while the filler included with the resin as described herein is predominantly silica, other filler particles commonly employed in the industry as resin fillers can be substituted in its place.

The preferred encapsulant formulation comprises 100 parts of a dimethoxy terminated polydimethylsiloxane resin having the structural formula:

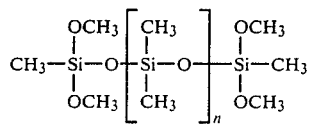

and having a viscosity of about 12,500 centistokes equivalent to a molecular weight of about 100,000, together with from 9 to 75 weight parts of a crosslinking agent per 100 hundred parts resin (phr) and 37 to 58 weight parts of a filler phr. The encapsulant also generally includes small quantities of a catalyst, typically from 0.1–1.0 phr, and a thermal stabilizer, typically from 0.1–0.2 phr as is known in the art.

The final formulation, as indicated above, must have a yield point stress of from 2000 to 3200 dynes/cm$^2$ and a viscosity of from 700,000 to $1.2 \times 10^6$ centipoise.

The preferred crosslinking agents are the lower trialkoxyalkylsilanes such as, trimethoxymethylsilane, triethoxymethylsilane and triproproxymethylsilane.

Since the crosslinking agents are generally used in excess, which excess must be removed during or after the curing process by evaporation, it is easier to remove excess trimethoxymethylsilane as compared to its higher molecular weight and hence higher boiling analogs. Consequently, this material is preferred, especially when used in a dry atmospheric condition. Under normal ambient conditions, however, the triethoxymethylsilane may be preferable although curing is slower than with the trimethoxy analog and the excess is more difficult to remove. This is because ambient moisture may cause too fast a cure rate with the trimethoxy analog. It should be noted that too fast a cure rate could be detrimental to the use of the encapsulant under commercial processing conditions.

The preferred fillers with this resin system are deactivated fillers such as fumed silica, titanium dioxide and the like, fumed silica generally being the most preferred filler material. Due to the fact that fumed silica is generally prepared by the decomposition of an ammoniated silane and that amines cause degradation of the polysiloxane resin, the fumed silica, before its use as a filler in this system, should be deammoniated.

Generally, the desired yield point and viscosity are reached by increasing the amount of crosslinking agent as the amount of filler increases.

Figure 4:
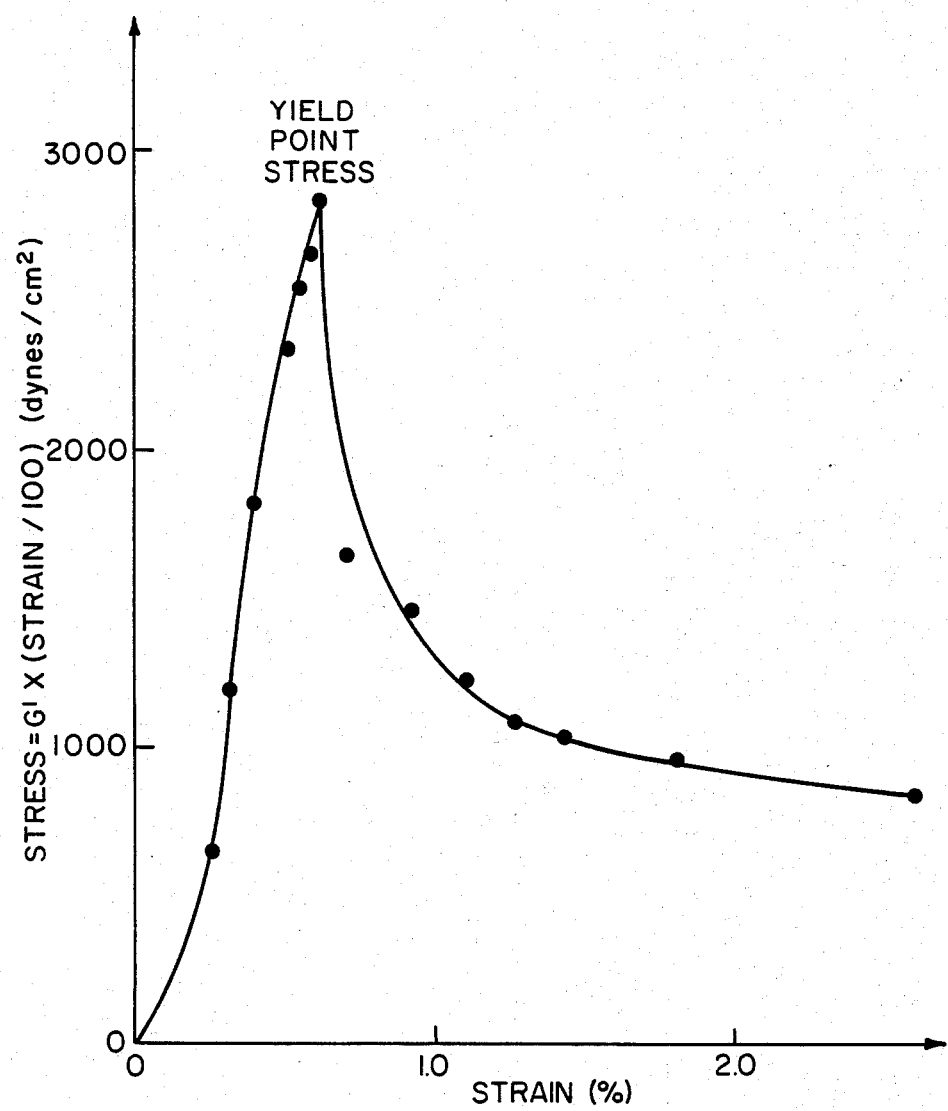
FIG. 4 is a graph plotting stress versus strain and showing the yield point of a suitable encapsulant formulation.

A specific example of a preferred encapsulant composition comprises 100 weight parts of the dimethoxy terminated polydimethylsiloxane, 63 weight parts trimethoxymethylsilane, 50 weight parts filler which filler comprises 46 weight parts deactivated, deammoniated fumed silica, 3.9 weight parts titanium dioxide and 0.1 weight parts carbon black, together with about 0.5 weight parts N-butyltitanate catalyst and about 0.2 weight parts of a chelate thermal stabilizer. This composition has a yield point stress as shown in FIG. 4 of about 2900 dynes/cm$^2$ at 0.8% strain. The viscosity of this material is about 900,000 centipoise.

Figure 3:
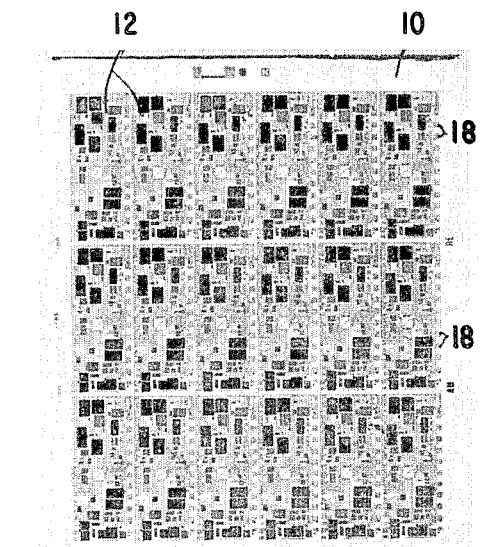
FIG. 3 (A-D) is a series of photographs representing processing steps in the manufacture of a hybrid circuit.
Figure 3:
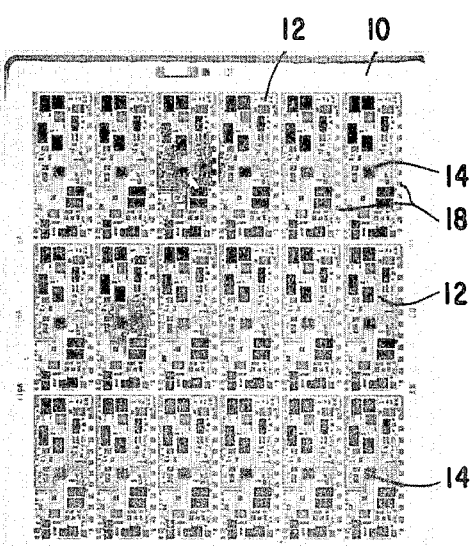
Figure 3:
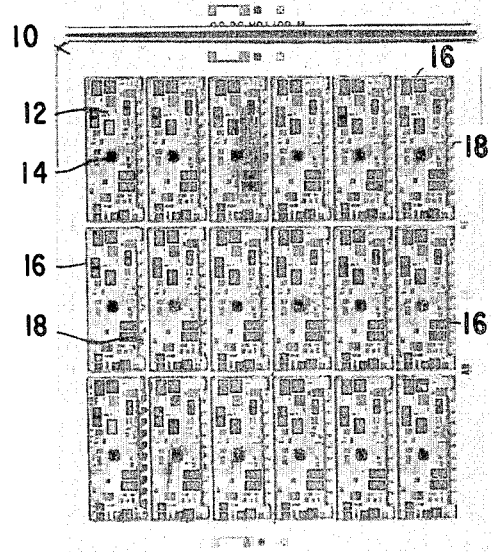
Figure 3:
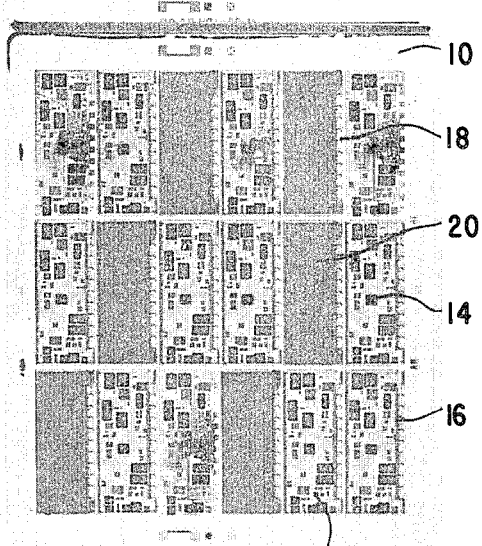

The aforementioned encapsulant can be applied to a hybrid circuit to encapsulate selected circuit areas essentially without wicking or run-over. FIG. 3 is a photomicrograph of this material applied to selected areas of a ceramic based hybrid circuit. As can be seen from the FIG., good control and definition can be achieved with the encapsulant placed in selected areas without any substantial wicking or run-over. The encapsulant can be applied to the circuit by any of the known techniques. For example, it can be applied by hand or by automatically utilizing a syringe type applicator or other apparatus which will extrude the encapsulant onto the desired areas of the device. One particularly useful application of the encapsulant is in the manufacture of hybrid integrated circuits. In accordance with the novel method, as can be seen from FIG. 3 (A–D), a substrate 10, e.g., a ceramic substrate, has formed on its surface a plurality of circuit patterns 12. Electronic devices, e.g., integrated circuit chips 14, are then mounted on each of the circuits 12 at the places provided therefor by usual mounting or bonding techniques, e.g., thermal compression bonding, ultrasonic bonding, etc. An encapsulant as set forth herein is then provided essentially around the periphery of each circuit pattern to provide a wall or dam 16 essentially around the entire pattern, except for the bonding pads 18 on each circuit 12, which pads 18 are used for connecting beam leads or other external connections. Encapsulant 20, which may be the same, similar or a different encapsulant formulation, is then flow coated over the circuit and the devices thereon contained within the dam 16. Generally, the encapsulant 20 is of a much lower viscosity than the encapsulant forming the dam. Such encapsulant may simply be made by adding a solvent to the first encapsulant so as to reduce its viscosity. The flow coating preferably should not exceed the height of the dam 16 to insure that the coating does not overflow over the dam 16. However, coating thicknesses somewhat greater than the dam height can be applied without run-over since surface tension will still confine the coating material to within the dam. Typically, the dam is from 5–10 mils wide and may be as high as 70 mils, if desired. Subsequent to flow coating and curing of the encapsulant, the substrate 10 is cut to form members containing individual circuits or a smaller plurality of circuits. Beam leads are then mounted, e.g., by reflow soldering, to the exposed unencapsulated bonding pads. By employing this method, an increase in product yield has been achieved due to the early protection of the devices and to the elimination of wicking and run-over. Also, labor costs have been reduced due to the elimination of the necessity of repairing circuits by removing excessive encapsulants due to wicking and run-over as occurs in the prior art method of fabrication.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of encapsulating a hybrid circuit formed from a substrate having a plurality of circuit patterns contained thereon, comprising the steps of:

(a) mounting individual or discrete circuit devices on preselected areas of each circuit pattern;

(b) applying a first encapsulant composition having a yield point stress of from 2000 to 3200 dynes/cm$^2$ and a viscosity of from 700,000 to $1.2 \times 10^6$ centipoise around the periphery of each circuit pattern on the substrate so as to form a wall or dam around each such circuit pattern, except for bonding pad areas used for making external connections to each of such circuits; and (c) applying a second encapsulant within the wall so as to cover and encapsulate each circuit pattern and device mounted thereon, said second encapsulant being applied to a level such that it is retained within the wall.

2. The method recited in claim 1 including the steps of:

(a) dividing the substrate into individual circuits for further processing; and (b) bonding leads for connectors to the exposed bonding pads of each of said circuits.

3. The method recited in claim 1 wherein said first encapsulant is a silicone resin based composition which includes a filler and a crosslinking agent.

4. The method recited in claim 3 wherein the first encapsulant is an RTV type silicone resin composition.

5. The method recited in claim 3 wherein the silicone is a dimethoxy terminated polydimethyl siloxane containing therein from 15 to 45 parts of filler per 100 parts of resin and from 5 to 50 parts of a trialkoxymethylsilane crosslinking agent per 100 parts resin.

6. The method recited in claim 5 wherein the dimethoxy terminated polydimethylsiloxane has a molecular weight of about 100,000 prior to curing, the filler is predominantly deactivated and deammoniated fumed silica and the crosslinking agent is selected from the group consiting of trimethoxymethylsilane and triethoxymethylsilane.

7. The method recited in claim 6 wherein the first encapsulant composition includes a butyl titanate catalyst and a thermal stabilizer.

8. The method recited in claim 6 wherein the crosslinking agent is trimethoxymethylsilane.

* * * * *